United States Patent [19]

McDowell

[11] 3,832,648

[45] Aug. 27, 1974

[54] RADIO FREQUENCY POWER GENERATOR UTILIZING NON-MAGNETIC SLUG TUNED COILS AND IMPEDANCE MATCHING NETWORK FOR USE THEREWITH

[76] Inventor: Robert Bruce McDowell, No. 2 Chestnut Ln., Metuchen, N.J. 08840

[22] Filed: May 29, 1973

[21] Appl. No.: 364,265

[52] U.S. Cl. .................. 331/74, 331/164, 331/169, 331/181

[51] Int. Cl. .......................... H03b 5/10, H03b 5/34

[58] Field of Search ........... 331/74, 75, 117 R, 167, 331/169–171, 181, 158, 164

[56] References Cited

UNITED STATES PATENTS 2,585,573 2/1952 Moore ............................ 331/75 X 2,636,941 4/1953 Singel et al. ..................... 331/75 X

*Primary Examiner*—Herman Karl Saalbach

*Assistant Examiner*—Siegfried H. Grimm

*Attorney, Agent, or Firm*—J. T. Martin; Gerald J. Ferguson, Jr.; Joseph J. Baker

[57] ABSTRACT

A radio frequency dielectric power generator and associated impedance matching network that requires only initial tuning at the time of manufacture, and will operate into a wide range of load impedances with no tuning required during operation. The equipment is readily adaptable to radio frequency sputtering techniques and radio frequency dielectric heating processes as well as any other applications requiring a radio frequency power supply of crystal controlled fixed frequency, such as communications, R.F. bias deposition, etc.

9 Claims, 6 Drawing Figures

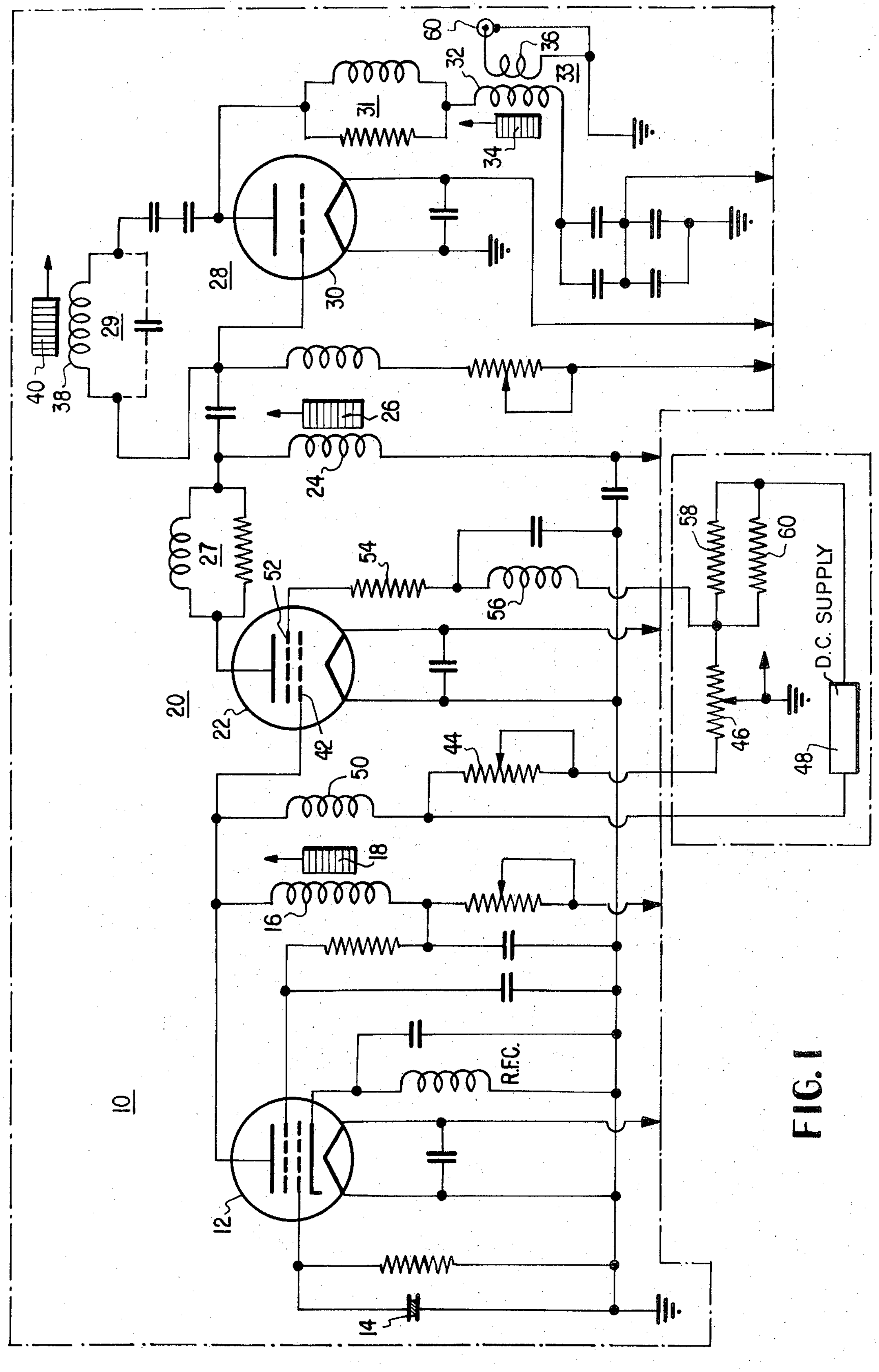
FIG. I

RADIO FREQUENCY POWER GENERATOR UTILIZING NON-MAGNETIC SLUG TUNED COILS AND IMPEDANCE MATCHING NETWORK FOR USE THEREWITH

BACKGROUND OF THE INVENTION

1. Field of the Invention

This invention relates to radio frequency power generators and, in particular, to such generators for use with loads, the impedance of which varies over a wide range.

2. DESCRIPTION OF THE PRIOR ART

This invention may be used in several areas. The state of the art in certain of these areas will be described.

a. Radio Frequency Sputtering Supplies

Typical state of the art radio frequency power generators contain crystal controlled oscillators, buffers, frequency multipliers, drivers and power amplifiers, all stages of which are tuned by means of either a grid and plate tank circuit tuning capacitor or only plate tank tuning capacitors or in some cases, powdered iron slug tuned coils. This type of circuitry requires tuning for each sputtering application, and/or tuning periods during operation or after warm-up periods have passed. Once the state of the art sputtering supplies have been tuned to an output impedance (generally 50 ohms), they should not require further tuning, except peaking from time to time, however, serious damage to the output circuitry can result from uncontrollable mismatch, due to the nature of the process, causing high amounts of reflected power.

The present state of the art impedance matching networks contain variable tuning capacitors in circuit configurations as shown in FIGS. 2A & 2B. The circuitry of these figures requires precise and sharp tuning, and further requires re-tuning for each impedance change of the sputtering load, which is commonly caused by (1) introduction of a grounded shutter for sputter cleaning, (2) pressure change, (3) temperature change, (4) electrode spacing change, and (5) often, a power level change. Dynamic tuning has often been tried, to overcome these problems, however, a servo system is slow in its response and therefore unpopular in this application. Thus, many dials must be tuned and retuned during a process to insure maximum forward power and minimum reflected power through the impedance transformation to the sputtering load.

b. Radio Frequency Dielectric Heat Sealing Generators

Radio frequency dielectric heat sealing generators are used for sealing plastics, forced drying of glue, drying of dielectric materials, etc. The present state of the art equipment is of the self-excited type, since the equipment works into a load of variable impedance, and the present state of the art equipment is of the high impedance output type. The press used for sealing two pieces of plastic is positioned so the top sealing electrode is resting on the top layer of the material to be sealed, with downward pressure applied. The lower sealing electrode is fixed in position, below the material to be sealed, directly indexed with the top electrode. Both electrodes are, in fact, a part of the plate tank circuit of the sef-excited power oscillator, and they represent capacity. When the materials to be sealed are at room temperature, they represent a dielectric of the capacitor (the output sealing electrodes) and they represent a certain fixed thickness. Hence, when the power is first applied, a certain frequency will be generated, due to the small amount of added plate tank capacitance the electrodes and the materials to be sealed represent. After the power is applied, the heating of the materials to be sealed and the pressure applied to the top sealing electrode will cause the dielectric (materials to be sealed) to become thinner and the two electrodes will come closer together, representing a higher capacitance, and causing an operating frequency shift in a lower direction. Therefore, it has, in the past, been impossible to use any form of crystal controlled radio frequency power equipment and/or impedance matching networks for this application because of the impedance change that causes a frequency change in self-excited power oscillators.

Furthermore, Part 18 - Volume II of the Federal Communications Commission Rules and Regulations requires that all industrial heating equipment have its radiation limited to 10 microvolts per meter at a distance of 1 mile. This limitation is virtually impossible with dielectric heat sealing equipment, since the sealing electrodes make very efficient antennas and sustain radiation from small power equipment to levels in excess of 10,000 micro-volts per meter at a distance of 1 mile. With the present state of the art radio frequency power equipment used for dielectric heat sealing applications, it becomes necessary to operate such equipment within a shielded area, such as a screen room, to meet the requirements of the Federal Communications Commission. Furthermore, costly radiation measurements must be taken and direct reading certification tests must be performed, with reports submitted to the F.C.C. before the equipment can be certified and legally operated.

c. Other Applications

In the communications (radio transmitting) field, particularly for armed services communications, aircraft communications, etc., transmissions may be required at multiple frequencies. An operator may have to switch from band to band and operate at different frequencies within a band. In the present invention this can be done without tuning or having mechanically ganged stages. Further, in the radio communications area, the variable frequency oscillator may be used in the present invention in lieu of a crystal controlled oscillator as will be brought out in more detail hereinafter.

SUMMARY OF THE INVENTION

Important objects of this invention are to eliminate the tuning of crystal controlled radio frequency sputtering supplies and to eliminate the tuning of impedance matching networks during the sputtering cycle, and to provide apparatus which will work into a relatively wide band of impedance changes, regardless of the impedance change cause, without the necessity for re-tuning.

A further object of this invention is to make possible the use of crystal controlled radio frequency dielectric heating generators and impedance matching networks for dielectric heat sealing applications where the impedance change of the load will not cause a frequency change, but will efficiently and effectively supply the required power to the load as required by the process.

A further object of this invention is to eliminate the need for a shielded enclosure or screen room around the equipment in use, since the equipment described is frequency stabilized through crystal control, and may operate on the designated I.S.M. (Industrial, Scientific and Medical) frequencies and within the frequency tolerances established by the Federal Communications Commission, thereby allowing unlimited radiation as stipulated under Section 18.102(*b*) of the F.C.C. Rules and Regulations. ISM frequencies are listed under Section 18.11(*a*), Volume II. Direct reading certification measurements are therefore unnecessary since the manufacturer of the equipment can supply the same under the prototype certification allowed.

A further primary object of this invention is to provide a unique radio frequency power supply that will not require any tuning, while in operation, and an impedance matching network that will not require any tuning, while in operation with the electrodes of a sputtering system or in operation with a dielectric heat sealing operation.

A further object of this invention is to provide a unique type of power output control in the driver stage of the R.F. power supply associating screen-grid control and control-grid control.

A further object of this invention is to provide a unique power amplifier tank circuit that cannot be damaged by reflected power, should such be present.

A further object of this invention is to provide a unique impedance matching network that will supply efficient power to the load under varying load conditions and will require no tuning while in operation, A further object of this invention is to provide a unique means to accomplish dielectric heat sealing processes with a stabilized frequency crystal controlled radio frequency power generator and a wide band impedance matching network.

A further object of this invention is to provide a unique radio frequency power source that, when used in conjunction with a variable frequency oscillator, can be varied in frequency, through a specific frequency band, with relatively constant power output over that frequency band.

A further object of this invention is to supply a unique radio frequency driver source that can be used to drive ultra-high power output additive stages.

A further object of this invention is to provide ultra-high power output stages that will require no tuning, while in operation, if either a frequency change is provided or an impedance change in the load occurs.

A further object of this invention is to provide an impedance matching network that will operate at a wide range of frequencies or at a wide range of output impedances, and will require no tuning under these conditions.

Other objects and advantages of this invention will become apparent upon reading the appended claims in conjunction with the following detailed description and the attached drawings.

BRIEF DESCRIPTION OF THE DRAWING

FIG. 1 is a schematic circuit diagram of an illustrative radio frequency power generator in accordance with this invention.

DESCRIPTION OF THE PREFERRED EMBODIMENTS

Figure 2A:
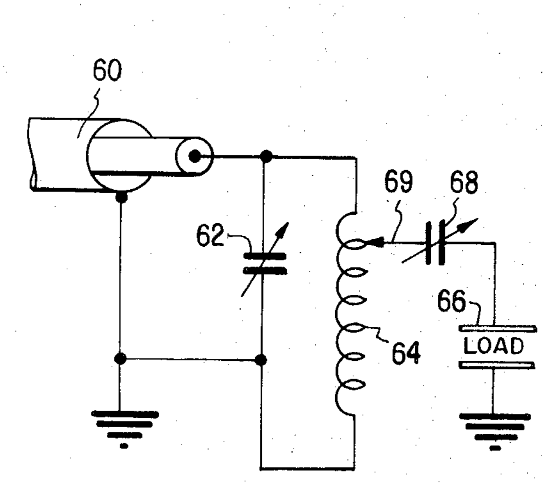
FIG. 2A (PRIOR ART)
FIGS. 2A and 2B are schematic circuit diagrams of prior art impedance matching networks.

Reference should be made to FIG. 1 which is a schematic diagram of an illustrative radio frequency power generator in accordance with this invention. A crystal controlled oscillator stage 10 includes a vacuum tube 12 and a crystal 14 connected in conventional oscillator configuration to cause oscillator 10 to produce a signal of a fixed frequency. The plate circuit of the oscillator is tuned to the fixed frequency by tuning coil 16 which includes a non-magnetic tuning slug 18. Conventional means and circuit elements are employed to provide bias voltages for the various electrodes of tube 12 as indicated in FIG. 1.

The output of the oscillator stage is applied to a driver stage 20 which includes a vacuum tube 22, a plate tuning coil 24 (including a non-magnetic tuning slug 26), and a plate trap circuit generally indicated at 27. The output of driver stage 20 is applied to power amplifier stage 28 which includes vacuum tube 30, tuning coil 32, and a plate trap circuit generally indicated at 31. Coil 32 is the primary winding of a transformer 33 and includes a non-magnetic tuning slug 34. The secondary winding of the transformer is coil 36. Transformer 33 provides a low output impedance and may be connected to the input of a coaxial line 60. The output of coaxial line 60 may be connected through an impedance matching network to a load (not shown in FIG. 1). A high impedance output may also be provided by taking an output from the plate side of coil 32. The electrodes of tube 30 are supplied with bias voltage in a conventional manner. The tube 30 has its plate to grid capacitance neutralized by a neutralization circuit 29 connected between the plate and grid which includes a tuning coil 38 and a non-magnetic tuning slug 40.

It is, of course, within the skill of the art to replace the vacuum tube embodiment of FIG. 1 with solid state elements without invention.

Novel means for varying the power output of the driver stage is also shown in FIG. 1. The grid 42 of tube 20 is connected through radio frequency choke 50, rheostat 44, and potentiometer 46 to ground. The grid 42 is also connected to the negative terminal of fixed voltage DC power supply 48 through radio frequency choke 50. The screen 52 of tube 20 is connected through resistor 54, radio frequency choke 56, and parallel resistors 58 and 60 to the positive terminal of power supply 48, as indicated in FIG. 1.

As the potentiometer 46 is advanced to the right in FIG. 1, the screen grid 52 is placed at ground potential and the control grid is biased to cutoff. At this point no power output is delivered from the plate of tube 20. As the potentiometer 46 is advanced to the left, full rated positive screen voltage is applied to the screen grid 52 of tube 20 and full rated negative D.C. bias voltage is applied to the control grid 42 of tube 20 and full rated power is delivered from the plate of tube 20. This novel power control therefore varies the power output of driver stage 20 through a complete swing of potentiometer 46. Since power amplifier 28 comprises a neutralized triode, the ultimate output power from the power amplifier is directly proportional to the radio frequency drive applied to the grid thereof. Hence, the power output from power amplifier 28 is adjustable from 0 to 100 percent through variation of the output from driver 20 by means of control potentiometer 46.

It should be noted that one of the most important aspects of this invention resides in the fact that no tuning capacitors are used at all. This applies to the plate tank coil design of each stage of the radio frequency power supply and the coil design of the impedance matching network, which will be described in more detail hereinafter. Thus, the only capacitance present is that of circuit losses and distributed capacitance across the coils. Both of these capacitances are very low. All non-magnetic tuning slugs are preferably non-grounded and typically comprised of brass. The use of ungrounded tuning slugs further lowers the circuit capacitance to thereby further increase the circuit bandwidth. The use of ungrounded, non-magnetic tuning slugs to tune the center frequency of the circuitry of FIG. 1 results in a circuit bandwidth of sufficient width to efficiently pass a wide range of frequencies. The use of such slugs to tune the center impedance of the impedance matching network further permits the radio frequency power generator of this invention to work into a wide range of load impedances.

The circuit of FIG. 1 may be operated at more than one frequency by providing a frequency multiplying circuit (not shown) between oscillator 10 and driver 20. Such an arrangement permits operation on all three I.S.M. frequencies if so desired. If such an arrangement were employed, it is preferable that each stage of the power generator have as many tuning coils as the number of operating frequencies. The coils could be ganged together so that for any particular operating frequency, the coils associated with that frequency would be switched in.

In lieu of the fixed frequency oscillator stage 10, a variable frequency oscillator may be used, such oscillators being conventional. Thus, if an electron coupled oscillator were used in place of a crystal oscillator, its output frequency must be one-half the crystal frequency if used in the grid circuit of the oscillator or the same as the crystal frequency if used in the cathode circuit. The use of such variable frequency oscillators in the radio frequency power generator of this invention permits frequency change with substantially constant output power.

Reference should now be made to FIG. 2A which illustrates a conventional impedance matching network of the prior art. As can be seen, the output of line 60 of FIG. 1 may be connected to a variable tuning capacitor 62 and a coil 64. The coil 64 is connected to load 66 through variable loading capacitor 68 from loading tap 69. The load 66 is diagrammatically representative of variable impedance loads such as the sputter electrodes of a radio frequency sputtering supply or the heating electrodes of a radio frequency dielectric heat sealing generator. Further, the load 66 is diagrammatically representative of fixed impedance loads such as may be utilized in radio frequency communications.

Figure 3A:
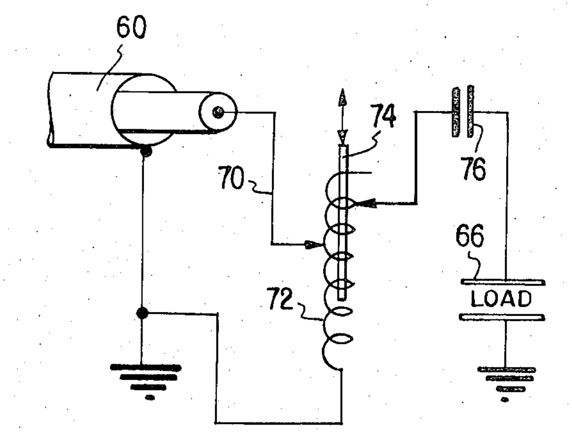
FIGS. 3A and 3B are schematic circuit diagrams of illustrative impedance matching networks in accordance with this invention.

Referring to FIG. 3A, there is shown an impedance matching network in accordance with this invention which may be used in place of the prior art circuit of FIG. 2A. Thus coaxial line 60 is connected through tap 70 to coil 72, which is tuned by non-magnetic slug 74, which is preferably a ungrounded, brass slug. Coil 72 is also tapped to load 66 through a fixed blocking condenser 76. The load 66 corresponds to that of FIG. 2A; however, the capability of the circuit of FIG. 3A to provide substantially constant power to load 66 over a wide impedance variation thereof is substantially improved with respect to the circuit of FIG. 2A. Further, the capability of circuit 3A to provide a substantially constant power output to load 66 over a wide frequency range of applied input signals is substantially improved over the circuit of FIG. 2A.

Figure 2B:
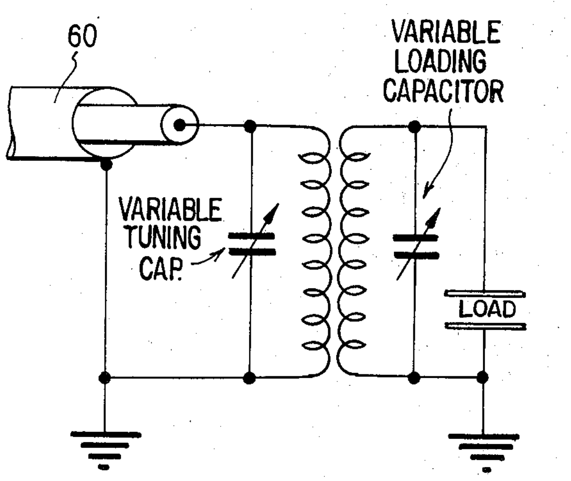
FIG. 2B (PRIOR ART)
Figure 3B:
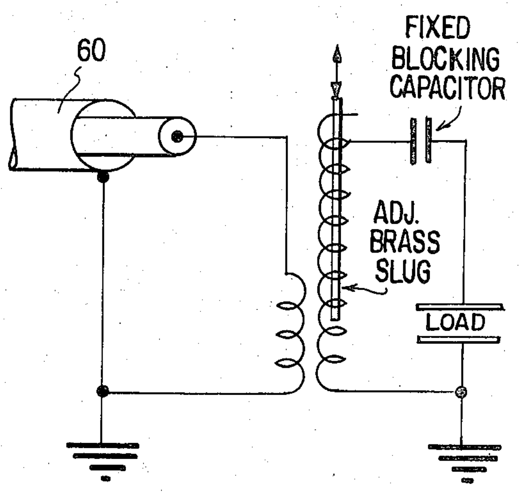

FIG. 2B illustrates another prior art impedance matching circuit and FIG. 3B illustrates an improved replacement therefor in accordance with this invention.

Figure 4:
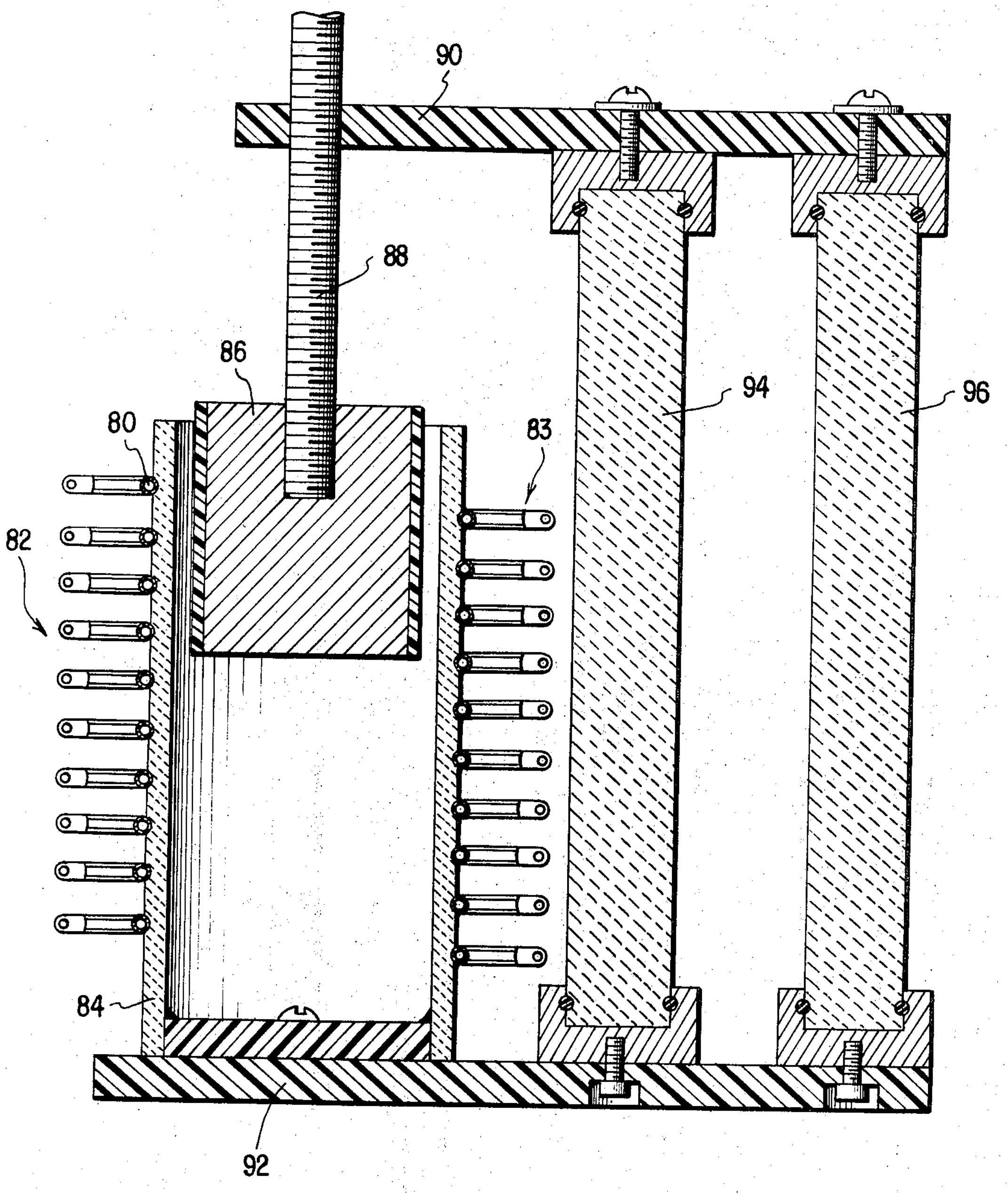
FIG. 4 is a cross-sectional view of an illustrative tuning means in accordance with this invention.

Reference should now be made to FIG. 4 which illustrates in cross-section a tuning coil 80 having a plurality of taps generally indicated at 82 and 83 mounted on a ceramic, fluted, coil form 84. A non-magnetic tuning slug 86 is secured to a threaded, non-magnetic, adjusting screw 88. The slug 86 and screw 88 are typically brass. Screw 88 is threaded through a support 90 which is spaced from a base 92 by insulating supports 94 and 96.

The tuning coil and slug of FIG. 4 are typically suitable for use as the tuning coil 72 and slug 74 of FIG. 3A or FIG. 3B. Further, the arrangement of FIG. 4 may be used as the tuning coils and slugs of the radio frequency power generator of FIG. 1. Of course, arrangements functionally equivalent to FIG. 4 may also be used.

Referring to FIGS. 3A and 3B, the impedance matching networks shown therein provide wide band operation in the same way as the radio frequency power supply of FIG. 1. Thus, they are preferably tuned only with ungrounded brass slugs. The radio frequency power supply is initially tuned for conventional meter dips in plate current while connected to a 50 ohm (for example) dummy load at the time of manufacture and requires no further tuning in operation. Since the triode 30 of FIG. 1 is neutralized (again by a brass slug-tuned coil), no further tuning is required even if the tubes are replaced.

The impedance matching networks of FIGS. 3A and 3B are connected to the load as indicated in the figures and the brass slug is tuned to the center impedance of the varying load 66 or to the center frequency of the frequency band it is to operate in. The taps connect the input to approximately 50 ohms (assuming a 50 ohm line) and the output to an impedance close to the operating impedance of the load. Preliminary tuning of the impedance matching network is effected with forward and reflected power meters connected between the radio frequency power supply of FIG. 1 and the impedance matching network of FIGS. 3A or 3B. The taps are then adjusted for maximum forward power and minimum reflected power with the load connected to the output of the impedance matching network. Once the position of the taps has been established, the brass slug is adjusted to give near zero reflected power. Once these adjustments are made for a given process no further tap changing or slug tuning is necessary.

Numerous modifications of the invention will become apparent to one of ordinary skill in the art upon reading the foregoing disclosure. During such a reading it will be evident that this invention provides a unique radio frequency power generator and impedance matching network for accomplishing the objects and advantages hereinstated.

What is claimed is:

1. System for applying radio frequency power to a load, said system comprising an oscillator stage having a tuning coil in circuit therewith for tuning said oscillator stage to a predetermined center frequency, said first tuning coil being the only tuning means for said oscillator stage and including a non-magnetic tuning slug;

a driver stage responsive to the output of said oscillator stage having a tuning coil in circuit therewith for tuning said driver stage to said center frequency, said last-mentioned tuning coil being the only tuning means for said driver stage and including a non-magnetic tuning slug; and a power amplifier stage responsive to the output of said driver stage having a tuning coil in circuit therewith for tuning said power amplifier stage to said center frequency, said last-mentioned tuning coil being the only tuning means for said power amplifier and including a non-magnetic tuning slug; and said load being responsive to the output of said power amplifier stage whereby the power applied to said load remains substantially constant over a broad range of impedances of said load or of frequencies applied thereto.

2. A system as in claim 1 where said load is a variable impedance load and said oscillator stage operates at a fixed frequency whereby substantially constant power is delivered to said load over the impedance range thereof.

3. A system as in claim 1 including an impedance matching network for approximately matching the output impedance of said power amplifier to that of said load, said impedance matching network including at least one tuning coil for tuning said impedance matching network to said approximate center frequency.

4. A system as in claim 1 where said oscillator stage is a variable frequency stage whereby the power delivered to said load is substantially constant over the frequency band of said variable frequency oscillator.

5. A system as in claim 1 where all said non-magnetic tuning slugs are unconnected to any source of reference potential.

6. A system as in claim 5 where said reference potential is ground.

7. A system as in claim 1 where said non-magnetic tuning slug is comprised of brass.

8. A system as in claim 1 where said driver stage includes a vacuum tube having control and screen grids and where said system includes means for varying the output power from said system from 0 to 100 percent, said last-mentioned means including control means for simultaneously controlling the bias potentials applied to said control and screen grids so that at a first setting of said control means said output power is 0% and at a second setting, the output power is 100 percent.

9. A system as in claim 8 where said control means includes (a) a potentiometer connected between said control grid and said screen grid, the tap of said potentiometer being connected to reference potential, (b) a source of D.C. voltage, the negative terminal connected to said control grid and the positive terminal to said screen grid so that when said potentiometer tap is set at the screen grid side of the potentiometer, said reference potential is applied to the screen grid and a cut-off negative voltage is applied to said control grid whereby the output power is 0 percent and when said potentiometer tap is set at the control grid side of the potentiometer, a positive potential is applied to said screen grid and an energizing potential is applied to said control grid whereby the output power is 100 percent.

* * * * *